Feb. 2, 1971 C. R. PAOLA 3,559,346

WAFER POLISHING APPARATUS AND METHOD

Filed Feb. 4, 1969 2 Sheets-Sheet 1

INVENTOR
C.R. PAOLA
BY
Roderick B Anderson
ATTORNEY

United States Patent Office 3,559,346
Patented Feb. 2, 1971

3,559,346
WAFER POLISHING APPARATUS AND METHOD
Carl R. Paola, Westfield, N.J., assignor to Bell Telephone Laboratories, Incorporated, Murray Hill and Berkeley Heights, N.J., a corporation of New York
Filed Feb. 4, 1969, Ser. No. 796,384
Int. Cl. B24b 7/00, 9/00, 1/00
U.S. Cl. 51—57 8 Claims

ABSTRACT OF THE DISCLOSURE

A wafer to be polished is mounted on one end of a mounting cylinder. An annular flange threaded to the mounting cylinder is adjusted such that the exposed wafer surface protrudes beyond a brake surface of the flange by a distance equal to the thickness of the wafer material to be removed. A stabilizing member slideably fits over the flange to form with the other components a polishing assembly that is then placed, wafer surface down, in a polishing pan. The pan is agitated such that the assembly describes a random motion until the wafer has been polished to its desired thickness, at which time the brake surface contacts the polishing surface of the pan and terminates movement of the assembly relative to the pan.

BACKGROUND OF THE INVENTION

This invention relates to techniques for polishing flat surfaces, and more particularly, for reducing the thickness of semiconductor wafers to a desired value.

One step in the fabrication of semiconductor devices, such as transistors and integrated circuits, is the controlled polishing of semiconductor wafers to a desired thickness. The tolerances required by such devices are becoming increasingly stringent, and several alternative techniques have been proposed and are in use for polishing wafers uniformly and reducing their thicknesses to precise values. It would of course be desirable to provide a technique that could be used by relatively unskilled workers without being either time consuming or imprecise.

Most present techniques require repeated thickness measurements of the wafer to determine when the polishing should be terminated. Apparatus has been proposed for automatically terminating polishing when the wafer has been reduced to its desired thickness, but generally speaking, such apparatus is relatively expensive, difficult to use, and subject to wear.

SUMMARY OF THE INVENTION

It is an object of this invention to reduce the expense, time and skill required for precision polishing of objects such a semiconductor wafers.

This and other objects of the invention are attained in an illustrative embodiment thereof comprising a mounting cylinder on one end of which the wafer to be polished is mounted. An annular flange having a flat brake surface at one end is threaded onto the mounting cylinder such that the brake surface lies on the same plane as the exposed surface of the wafer. This is preferably accomplished by placing the mounting cylinder in a fixture, resting a reference bar on the brake surface, and threading the flange until the reference bar contacts the exposed wafer surface.

The flange and the mounting cylinder include radial index marks that can be registered with each other. With the use of these index marks, the operator then threads the flange such that the wafer surface protrudes beyond the brake surface by a distance equal to the thickness of the wafer to be removed by polishing. A hollow cylindrical locking member is threaded onto the mounting member to lock the flange in position. The mounting member is removed from the fixture, a stabilizing member is slideably mounted on the flange, and the polishing assembly is placed, wafer surface down, in a polishing pan.

The polishing pan is agitated such that the polishing assembly describes a random motion along a polishing surface of the pan. During the polishing operation the stabilizing member contacts the polishing surface and keeps the wafer surface flush with the polishing surface, but is free to slide vertically on the flange. As the pan agitates, the relative movement of the polishing assembly causes the exposed wafer surface to be polished as is desired. After the wafer surface has been sufficiently reduced in thickness, the brake surface of the flange contacts the polishing pan, and the friction between the pan and the brake surface terminates relative movement of the polishing assembly with respect to the pan. When the operator sees that the polishing assembly has stopped moving, he knows ehat the polishing has been completed, and he removes the finished wafer from the assembly.

As will become clear from the discussion to follow, the polishing apparatus is inexpensive and easy to use with speed and facility by a relatively unskilled operator. Nevertheless, the technique is capable of polishing with greater precision than many other competing techniques presently in use. The apparatus itself is subject to little wear and therefore has a long lifetime and no components that need periodic replacement. Finally, the polishing operation does not require periodic monitoring of the wafer thickness; rather, the polishing is automatically terminated when the desired wafer thickness has been reached.

These and other objects, features and advantages of the invention will be better understood from a consideration of the following detailed description, taken in combination with the accompanying drawing.

DRAWING DESCRIPTION

DETAILED DESCRIPTION

Figure 1:
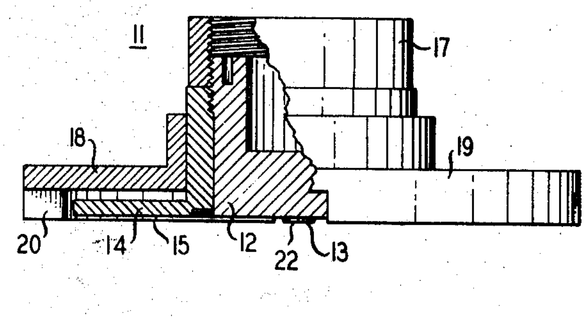
FIG. 1 is a sectional view of a wafer polishing assembly in accordance with an illustrative embodiment of the invention.
Figures 2, 3:
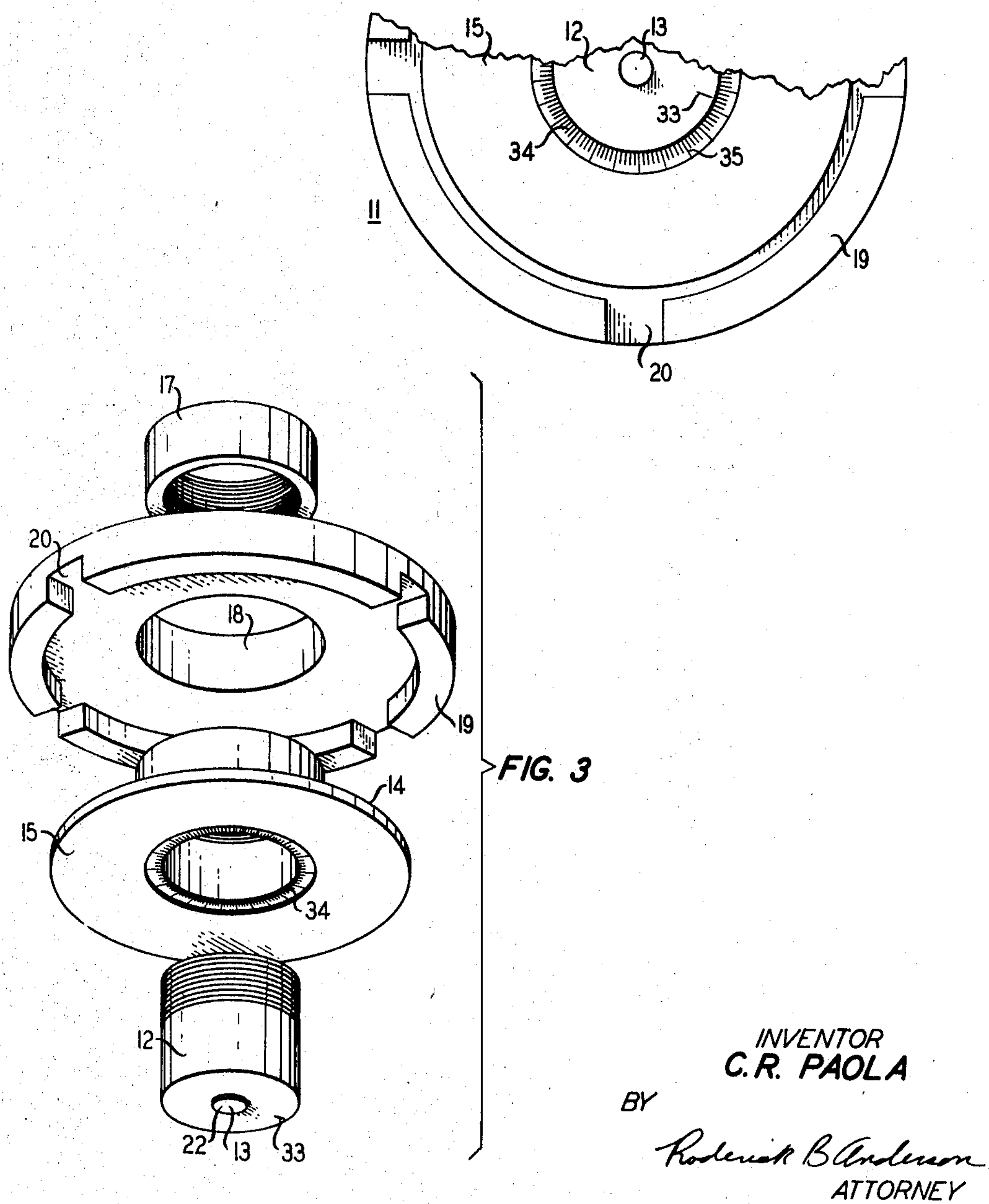
FIG. 2 is a bottom view of part of the polishing assembly of FIG. 1.
FIG. 3 is an exploded view of the polishing assembly of FIG. 1.

Referring now to FIGS. 1, 2 and 3, there is shown a polishing assembly 11 comprising a cylindrical mounting member 12 on one end of which is mounted a semiconductor wafer 13 to be polished to a desired thickness. The wafer 13 is bonded to the mounting cylinder by wax or other appropriate adhesive material. An annular flange 14 having a relatively large area brake surface 15 is threaded to and surrounds the cylindrical mounting member 12. An annular locking member 17 is also threaded to the mounting member and locks the flange 14 in position. A stabilizing member 18, having a peripheral wall 19 that surrounds the brake surface, is slideably mounted on the flange 14. The peripheral wall includes a plurality of slots 20.

The axial position of the flange 14 is adjusted, by a technique to be described later, such that the exposed surface 22 of wafer 13 protrudes beyond brake surface 15 by a distance equal to the thickness of the wafer to be removed by polishing; for example, if .005 inch of wafer material is to be removed, the flange 14 is adjusted such that wafer surface 22 protrudes beyond brake surface 15 a distance of .005 inch.

Figures 4, 5, 6:
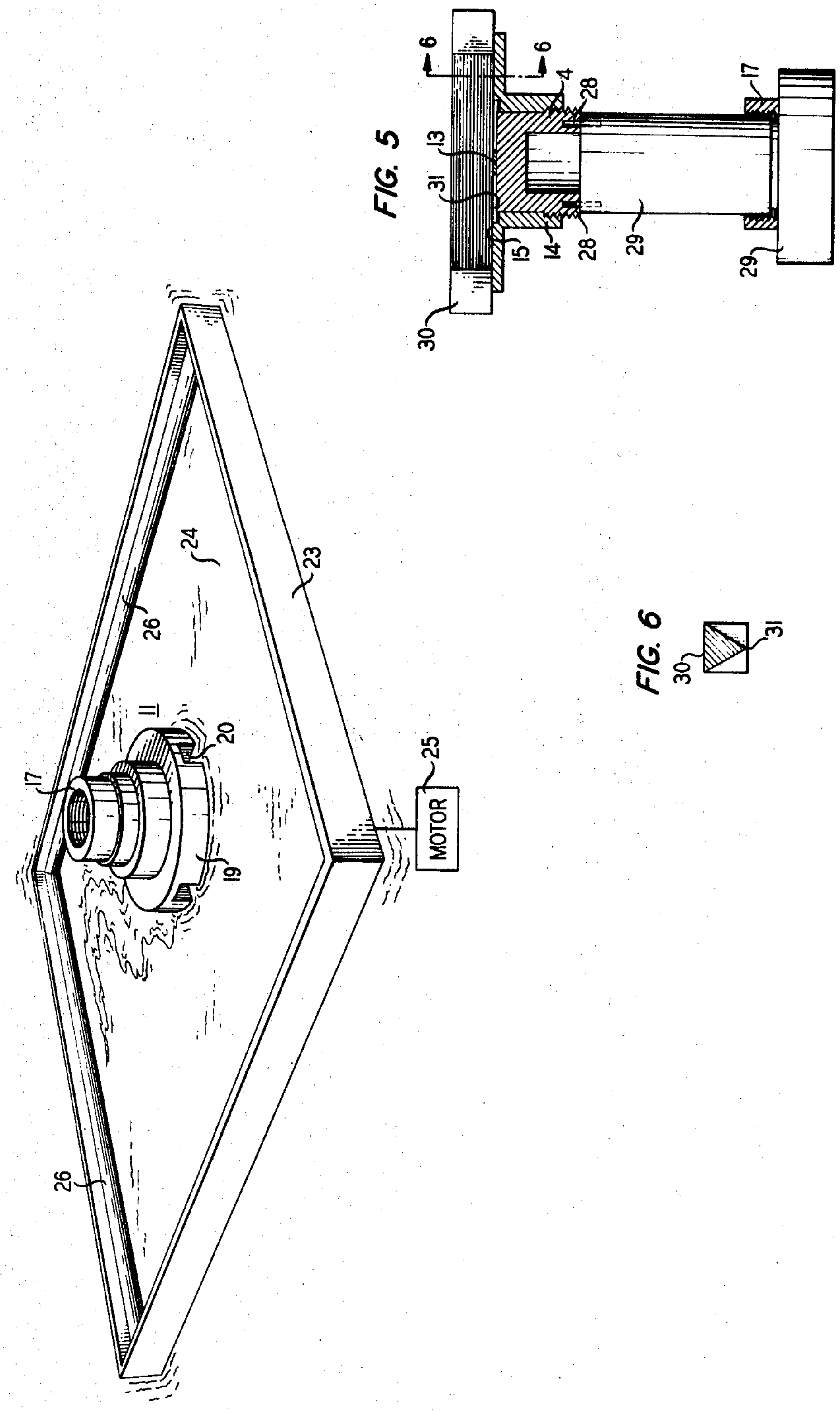
FIG. 4 is a perspective view of the polishing apparatus in which the polishing assembly of FIG. 1 is used.
FIG. 5 is a partial sectional view of the apparatus used in the calibration of the polishing assembly of FIG. 1.
FIG. 6 is a view taken along line 6—6 of FIG. 4.

Referring to FIG. 4, the polishing assembly 11 is placed in a polishing pan 23 such that the wafer contacts a polishing surface 24 of the pan. The pan is driven by an appropriate motor 25 such that the polishing assembly 11 describes a random motion as it moves with respect to the pan. The motor, for example, may drive the pan along an elliptical path at a velocity sufficient to give relative movement between the pan and polishing assembly 11. A polishing compound known as "slurry," which for example may be a mixture of aluminum oxide ($Al_2O_3$) in water, covers the surface 24 of the polishing pan.

As the polishing assembly 11 is agitated by the polishing pan there is little wear of the peripheral wall 19 because stabilizing member 18 is free to slide vertically. The only function of stabilizing member 18 is to prevent the wafer from tilting slightly with respect to the polishing surface 24, and it thereby insures that the wafer is at all times flush with the polishing surface. While the stabilizing member 18 should be free to slide vertically on the flange 14, the fit should be sufficiently tight to prevent any tilting of the stabilizing member with respect to the central axis of the assembly.

The slots 20 in the stabilizing member permit the slurry to flow freely during the agitation and prevent it from accumulating in any one place. A continuous rubber bumper 26 extending around the inner surface of the polishing pan aids the random motion of the polishing assembly by causing the assembly to rebound from the side of the pan during polishing. Random motion of the assembly 11, uniform distribution of the slurry, and uniform polishing of the wafer, require that the polishing surface 24 be in a horizontal plane. Many assemblies can be included in the pan for simultaneous polishing of many wafers. The rebounding of these assemblies from each other does not adversely affect the randomness of agitation nor the uniformity of wafer polishing.

After the desired thickness of wafer 13 has been removed, brake surface 15 of the polishing assembly makes contact with polishing surface 24. The velocity of pan 23 is chosen to be sufficiently high to give relative movement between the pan and the polishing assembly when only the wafer and stabilizing member contact the polishing surface, but insufficiently high to give relative movement when the brake surface contacts the polishing surface. Thus, when the brake surface 15 contacts the pan, the increased friction between the polishing assembly and the pan terminates the random motion of the polishing assembly, and the polishing assembly is stationary with respect to the pan. The termination of relative motion of the polishing asembly is of course clearly observable by the operator, and at that point he stops the motor 25 and removes the polished wafer from the assembly. Even if the assembly is not immediately removed from the pan, there is substantially no wear or polishing of brake surface 15 because of the absence of movement of the brake surface relative to the moving pan. Notice also that there is no necessity for monitoring the wafer thickness during the course of polishing.

It can be appreciated that after the wafer is removed from the assembly its thickness has been reduced by an amount equal to the distance which exposed wafer surface 22 protruded beyond brake surface 15 as shown in FIG. 1. FIG. 5 illustrates apparatus for aiding in establishing this distance with a high degree of accuracy prior to polishing.

After the wafer has been waxed to the mounting cylinder 12, flange 14 is threaded onto the mounting cylinder to form a subassembly that is mounted by pins 28 on a fixture 29. A reference bar 30 rests on the brake surface of flange 14 and extends across the wafer 13. As shown in FIG. 5, part of the bar 30 has a triangular cross section which defines a reference line 31. The flange 14 is threaded onto the mounting member until the reference line 31 makes contact with the exposed surface of the wafer 13.

If the bar 30 is machined such that reference line 31 is precisely perpendicular to the axis of the subassembly, the flange position at which the reference line contacts the wafer can be determined with a high degree of precision. When this position is reached, the brake surface is on a common plane with the exposed wafer surface 22 and the reference bar is removed.

As can be seen from FIG. 2 the mounting cylinder inludes a radial index mark 33 which may be registered with index marks 34 and 35 on the flange 14. These reference marks are used to calibrate the extent to which the flange is subsequently threaded onto the mounting cylinder 12. Assume, for example, that the flange moves axially by .0005 inch each time one of the major divisions separated by index marks 35 is rotated past index mark 33. Then, if .005 inch of the wafer is to be removed, the flange is threaded such that ten major divisions separated by index marks 35 are rotated past the index mark 33. This being done, the wafer surface 22 protrudes beyond the brake surface 15 by the desired amount, and locking member 17, which is essentially a thumb nut, is screwed onto the mounting cylinder to lock the flange 14 in place. The subassembly is then removed from fixture 29, the stabilizing member 18 is slideably mounted on it as shown in FIG. 1 to complete the polishing assembly, and the polishing operation proceeds as described before.

With suitable threads between the flange and mounting cylinder, the index lines 34 may be 2.88° apart and represent an axial displacement of .0001 inch between the brake surface and the mounting cylinder, while the major index lines 35 are 14.4° apart and represent an axial displacement of .0005 inch.

From the foregoing it can be appreciated that, given the amount of thickness of a semiconductor wafer to be removed, a relatively unskilled operator can simply and expediently adjust the polishing assembly to give the required degree of polishing. Construction of the apparatus to give precision polishing to within approximately .0001 inch is well within the skill of a worker in the art, and compared to alternative apparatus construction, is relatively inexpensive.

The apparatus and method that has been described is intended merely to be illustrative of the inventive principles involved. Various other embodiments and modifications may be made by those skilled in the art without departing from the spirit and scope of the invention.

What is claimed is:

1. The method of polishing a flat surface on a wafer through the use of a polishing assembly comprising a cylindrical mounting member, an annular flange threaded to and surrounding the mounting member and having a flat brake surface, and a stabilizing member slideably mounted on the annular flange, said method comprising the steps of:

mounting the wafer on an end of the cylindrical mounting member;

threading the flange such that the exposed wafer surface protrudes beyond the brake surface by a distance equal to the wafer thickness to be polished;

placing the polishing assembly in a polishing pan with the wafer in contact with a polishing surface;

agitating the pan at a velocity sufficiently high to give relative movement between the polishing surface and the wafer, but insufficiently high to give substantial relative movement between the polishing surface and the brake surface when the brake surface is in full contact therewith;

maintaining such agitation until the relative movement of the polishing assembly with respect to the pan has substantially terminated;

and removing the wafer from the polishing assembly.

2. The method of claim 1 wherein the step of locating the brake surface with respect to the wafer surface comprises the steps of:

orienting the polishing assembly with the exposed wafer surface facing upwardly;

resting a reference member, having a surface that describes a straight line, on the brake surface such that the straight line overlaps the exposed wafer surface;
threading the flange until the wafer surface contacts the line-describing surface of the reference member;
removing the reference member;
and further threading the flange a distance equal to the wafer thickness to be polished.

3. Wafer polishing apparatus comprising:
a mounting member;
means for affixing one surface of a wafer to be polished to the mounting member such that the other wafer surface is exposed;
an annular flange threaded to and surrounding the mounting member;
the flange including on one end a flat brake surface that is parallel to the exposed wafer surface;
said flange being threadably adjusted such that the wafer surface extends beyond the brake surface by a distance equal to the thickness of the wafer to be removed;
and means for polishing the wafer comprising a flat polishing surface that extends beyond the periphery of the brake surface, whereby the polishing surface contacts the brake surface to terminate polishing of the wafer when the desired wafer thickness has been removed.

4. The wafer polishing apparatus of claim 3 further comprising:
radially extending indicia on contiguous end surfaces of the mounting member and flange, whereby relative axial displacement of the wafer surface from the brake surface can be ascertained by observing the relative angular displacement of the indicia on the flange and mounting member.

5. The wafer polishing apparatus of claim 3 wherein:
the polishing surface constitutes the bottom surface of a polishing pan; and further comprising:
means for agitating the pan at a velocity sufficiently high to give relative movement between the polishing surface and the wafer, but insufficiently high to give substantial relative movement between the polishing surface and the brake surface when the brake surface is in full contact therewith.

6. The wafer polishing apparatus of claim 5 further comprising:
a stabilizing member surrounding and slideably mounted on the flange;
and means for maintaining the wafer surface flush with the polishing surface comprising a peripheral wall portion on the stabilizing member that extends beyond the brake surface to contact the polishing surface.

7. The wafer polishing apparatus of claim 6 further comprising:
radially extending indicia on contiguous end surfaces of the mounting member and flange, whereby a relative axial displacement of the wafer surface from the brake surface can be ascertained by observing the relative angular displacement of the indicia on the flange and mounting member.

8. The wafer polishing apparatus of claim 7 further comprising:
a reference member having a surface that defines a straight line;
the reference member having a length greater than the the inner diameter of the brake surface, whereby the reference member may be rested on the exposed surface of the brake surface prior to polishing and the flange threaded to bring the wafer surface in contact with the line-defining surface to establish a reference location of the flange, thereby permitting the brake surface to be moved the precise desired axial distance from the wafer surface with the aid of said indicia.

References Cited

UNITED STATES PATENTS

| | | | |
|---|---|---|---|
| 2,983,086 | 5/1961 | LaChapelle | 51—131 |
| 3,233,370 | 2/1966 | Best et al. | 51—131 |
| 2,979,868 | 4/1961 | Emeis | 51—131 |
| 2,971,298 | 2/1961 | Garthwaite et al. | 51—131 |

JAMES L. JONES, Jr., Primary Examiner

U.S. Cl. X.R.

51—131, 283